United States Patent [19]

Porro et al.

[11] 4,303,866

[45] Dec. 1, 1981

[54] METHOD AND DEVICE FOR MOUNTING PIECES INSIDE THE VACUUM CHAMBER OF AN ELECTRON MICROSCOPE

[75] Inventors: Francesco Porro, Gallarate; Cosimo Gabriele, Busto, both of Italy; Walter Hotz, Beringen, Switzerland

[73] Assignee: Costruzioni Aeronautiche Giovanni Agusta S.p.A., Varese, Italy

[21] Appl. No.: 154,211

[22] Filed: May 29, 1980

[30] Foreign Application Priority Data

Jun. 12, 1979 [IT] Italy ................................ 68259 A/79

[51] Int. Cl.³ .............................................. G21K 5/10
[52] U.S. Cl. ..................................... 250/442; 250/441
[58] Field of Search ............... 250/441, 442, 457, 491, 250/310

[56] References Cited

U.S. PATENT DOCUMENTS

| | | | |
|---|---|---|---|
| 3,858,049 | 12/1974 | Koch et al. | 250/442 |
| 3,886,358 | 5/1975 | McLaughlin et al. | 250/441 |
| 3,983,402 | 9/1976 | Arndt et al. | 250/441 |

*Primary Examiner*—Bruce C. Anderson
*Attorney, Agent, or Firm*—Kane, Dalsimer, Kane, Sullivan and Kurucz

[57] ABSTRACT

A method for mounting pieces inside the vacuum chamber of an electron microscope, said chamber including a fixed cup-shaped body laterally closed by a mobile closure element supporting a piece holder, and detection means disposed inside said chamber; the method providing for provision of a transparent rigid mask which reproduces the shape of said chamber and said detection means, and is to be arranged in contact with said closure element before closing it to adjust the position of the piece to be observed.

2 Claims, 1 Drawing Figure

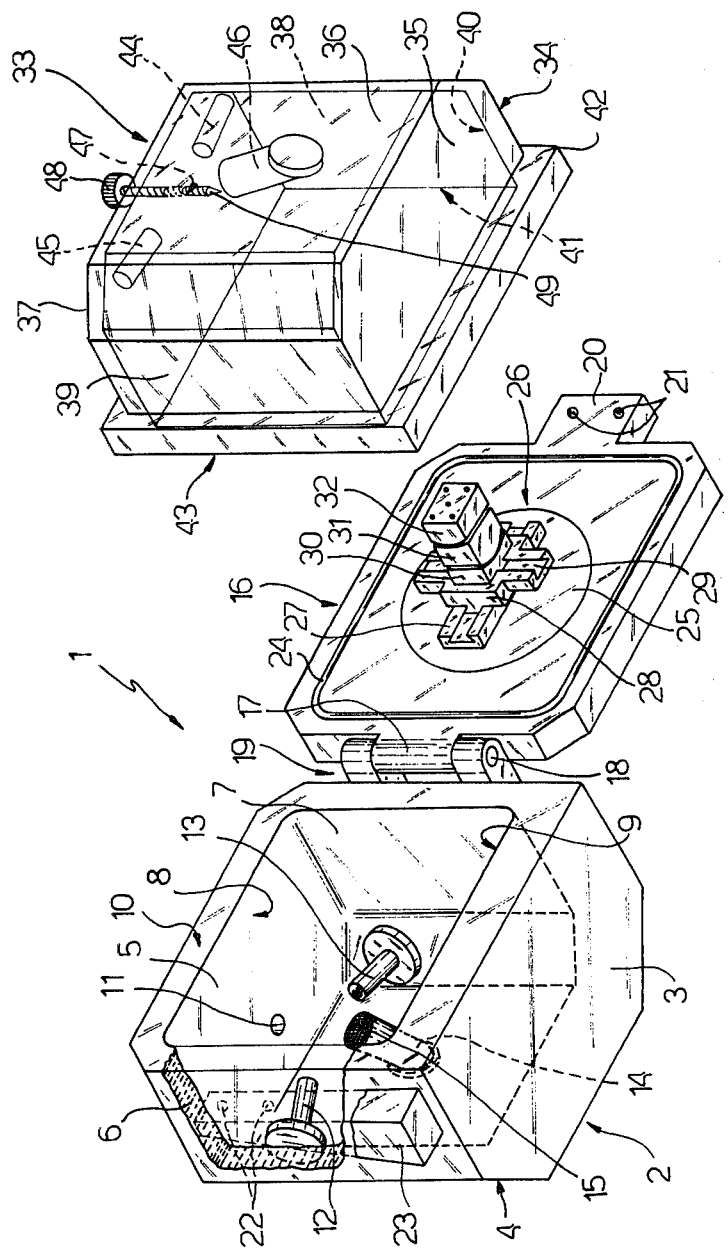

METHOD AND DEVICE FOR MOUNTING PIECES INSIDE THE VACUUM CHAMBER OF AN ELECTRON MICROSCOPE

BACKGROUND OF THE INVENTION

This invention relates to a method for mounting pieces inside the vacuum chamber of an electron microscope, particularly a scanning electron microscope.

In known scanning electron microscopes, all observations made on the pieces to be examined are carried out by inserting the pieces into a vacuum chamber disposed at the lower end of an electronic-optical column, and comprising a cup-shaped body of substantially horizontal axis, the inner cavity of which is accessible through a lateral aperture. During observations, this latter is closed in an airtight manner by means of a door, which is normally hinged to a lateral wall of said cup-shaped body so that it rotates relative to this latter about a substantially vertical axis between a closed position and an open position.

Normally a piece holder is connected to said rotatable door, this piece holder projecting into the cup-shaped body when the door is closed and being arranged to support a piece to be examined in a position which can be adjusted along at least three axes by means of micrometer adjustment devices extending outwards from said door.

In general, the operation involved in mounting a piece for observation on the relative piece holder is extremely long and delicate, as said piece is mounted when the door is open, and must be disposed such that when the door has been closed it is in a position as close as possible to the correct observation position.

This is not always easy to do, and in addition there is always the risk that during adjustment operations made after the door has been closed, the piece strikes against one of the detection devices disposed inside the vacuum chamber. As such a happening must be avoided, known electron microscopes normally comprise a generally acoustic alarm system which warns the operator when the piece to be observed strikes against any obstacle.

In spite of the use of alarm systems, the adjustment of the position of the piece before observations is always problematical and laborious, and requires a time such as to drastically reduce the actual time available for making observations with the microscope.

SUMMARY OF THE INVENTION

The present invention relates to a method able to considerably reduce the time required for adjusting the position of the piece to be observed inside the vacuum chamber, and to prevent the piece to be observed from coming into contact, during this adjustment, with the walls of the vacuum chamber and/or of the detection devices contained therein.

In this regard, it should be noted that such contact is extremely dangerous, and can easily cause fracture of the piece holder and/or said detector devices due to the fact that, as stated, the movements are transmitted to the piece by means of micrometer devices normally of mechanical operation.

The present invention provides a method for mounting pieces inside the vacuum chamber of an electron microscope, said chamber comprising a fixed cup-shaped body with a lateral aperture closed in an airtight manner by a mobile closure element supporting a piece holder, and detection means disposed inside said chamber; the method being characterised by comprising the following stages:

disposing said closure element in an open position;

mounting a piece for observation on said piece holder;

positioning on said closure element a rigid mask made of transparent material and constituted by a cup-shaped body having a cavity which is identical in shape and dimensions to that of said fixed cup-shaped body provided with said detection means;

adjusting the position of the piece to be observed to bring it into the correct position for initiating observations;

moving the closure element into its closed position after removing said mask.

The method as heretofore defined enables the operator, by using said transparent mask, to see into the vacuum chamber, and to therefore adjust the position of the piece very rapidly and reliably, without any danger of damaging the piece holder and/or detection systems.

The present invention also provides a device for carrying out the method as heretofore defined, said device comprising a rigid mask made of transparent material and constituted by a cup-shaped body having a cavity which is identical in shape and dimensions to that of said fixed cup-shaped body provided with said detection means.

BRIEF DESCRIPTION OF THE DRAWING

Further characteristics and advantages of the present invention will be more apparent from the description given hereinafter with reference to the accompanying drawing, which represents a diagrammatic exploded perspective view of one non-limiting embodiment thereof.

DETAILED DESCRIPTION OF THE INVENTION

The accompanying FIGURE shows the vacuum chamber 1 of a scanning electron microscope disposed at the bottom of an electronic-optical column, not shown, and comprising a fixed cup-shaped body 2 of substantially horizontal axis constituted by a lower wall 3, a rear wall 4, an upper wall 5 and two side walls 6 and 7. These walls define a cavity 8 substantially in the form of a rectangular prism and communicating with the outside through a front lateral aperture 9 defined by the walls 3, 5, 6 and 7, and surrounded by a flat annular surface 10.

A through bore 11 is provided in the upper wall 5 in proximity to the rear wall 4, and through which an electron beam produced and focused inside said electronic-optical column penetrates into the cavity 8. The axis of said electron beam is intersected by the axis of a WDS collimator 12, i.e. a X-ray beam collimator for a wavelength dispersion detection system, and by the axis of a EDS collimator 13, i.e. a beryllium collimator for an energy dispersion detection system. Said two collimators 12 and 13 comprise two cylinders disposed in a horizontal plane and inclined towards each other and towards the axis of the bore 11.

In the chamber 8 there is also disposed a photomultiplier 12 for secondary electrons for image detection, consisting of an inclined cylinder extending upwards from the inner surface of the rear wall 4, and provided at its end with a Faraday cage 15.

The chamber 1 also comprises a sealing element consisting of a substantially flat door 6 with a lateral vertical sleeve 17 hinged by a pin 18 to a fork 19 rigidly connected to the outer surface of the wall 7 and projecting to the front of the surface 10. On the side opposite the sleeve 17, the door 16 is provided with an appendix 20 having two through bores 21 arranged to receive screws, not shown, which cooperate with bores 22 provided through a fixed upright 23 in order to lock the door 16 in its closed position. In this position, the door 16 cooperates in an airtight manner with the annular surface 10 by way of an annular seal gasket 24 carried by the door 16.

A plate 25 rotatable about a horizontal axis is mounted through the door 16, and constitutes the base plate of a piece holder 26, the movements of which can be controlled from the outside by micrometer control devices, not shown.

In addition to the plate 25, the piece holder 26 also comprises a guide 27 rigidly connected to the inner surface of the plate 26 and perpendicular to the axis of this latter, and a slide 28 mounted slidable along the guide 27. The slide 28 supports a guide 29 having its axis perpendicular to the axis of the guide 27, and slidably supporting a second slide 30. This latter supports a third slide 31 which can swivel about an axis parallel to the axis of the guide 29, and said third slide supports a fourth slide 31 which can swivel about an axis parallel to the axis of the guide 27, and to which a piece to be examined (not shown) can be connected.

When in operation, the position of the piece to be examined connected to the slide 32 is adjusted, with the door 16 open, by way of a rigid mask 33 of transparent material comprising a cup-shaped body 34 consisting of a lower wall 35, a rear wall 36, an upper wall 37 and two side walls 38 and 39. These walls define a cavity 40 identical to the cavity 8 and communicating with the outside through an aperture 41 identical to the aperture 9 and surrounded by a flange 42, the front surface 43 of which is substantially identical to the surface 10.

Inside the chamber 40 there are disposed three cylinders 44, 45 and 46, which are respectively identical in position and dimensions with the collimators 12 and 13 and with the photomultiplier 14. A threaded pin 48 is mounted through a through bore 47 provided in the wall 37 in a position corresponding to that of the bore 11, the free end 49 of the threaded pin 48 representing the focus position for the beam, and being adjustable upwards and downwards between two end positions defining an optimum field of variation of the position of the beam focus.

In order to adjust the position of the piece to be examined, the operator places the mask 33, with the door 16 open, in a position facing the piece holder 26, with the flange 42 abutting against the gasket 24. By adjusting said micrometer control devices, the operator then adjusts the device 26 so as to bring the piece to be examined into the required position relative to the cylinders 44, 45 and 46 and relative to the point 49 by observing the movements of the piece through the transparent walls of the mask 33.

When the required position has been attained, the mask 33 is removed, and the piece to be examined is conveyed into the required position inside the chamber 8 by simply closing the door 16.

If the piece to be examined is of complicated shape, the operator, with the aid of the mask 33, can record all the adjustment operations necessary to remove the piece from an initial safe position to its final required position. Then when the mask 33 has been removed, the piece is returned to said initial position, and the previously recorded adjustment operations can then be repeated with the door 16 closed.

What we claim is:

1. A method for mounting pieces inside the vacuum chamber of an electron microscope, said chamber comprising a fixed cup-shaped body with a lateral aperture closed in an airtight manner by a mobile closure element supporting a piece holder, and detection means disposed inside said chamber; the method being characterised by comprising the following stages:
    disposing said closure element in an open position;
    mounting a piece for observation on said piece holder;
    positioning on said closure element a rigid mask made of transparent material and constituted by a cup-shaped body having a cavity which is identical in shape and dimensions to that of said fixed cup-shape body provided with said detection means;
    adjusting the position of the piece to be observed to bring it into the correct position for initiating observations;
    moving the closure element into its closed position after removing said mask.

2. The method of claim 1 wherein an adjustable means for simulating the focus position of an electron beam fed into said fixed cup-shaped body is mounted through the upper wall of said mask.

* * * * *